(12) United States Patent
Koonath et al.

(10) Patent No.: US 8,089,684 B1
(45) Date of Patent: Jan. 3, 2012

(54) PHOTONIC RF AND MICROWAVE PHASE SHIFTERS

(75) Inventors: Prakash Koonath, La Crescenta, CA (US); Lute Maleki, Pasadena, CA (US)

(73) Assignee: OEwaves, Inc., Padadena, CA (US)

(*) Notice: Subject to any disclaimer, the term of this patent is extended or adjusted under 35 U.S.C. 154(b) by 149 days.

(21) Appl. No.: 12/405,113

(22) Filed: Mar. 16, 2009

Related U.S. Application Data

(60) Provisional application No. 61/036,858, filed on Mar. 14, 2008.

(51) Int. Cl.
*G02F 1/01* (2006.01)
*G02F 1/00* (2006.01)
*G02F 1/03* (2006.01)

(52) U.S. Cl. .................. 359/279; 359/237; 359/245

(58) Field of Classification Search .................. 359/237, 359/245, 251, 276–279, 256, 264, 239; 372/32; 250/227.11
See application file for complete search history.

(56) References Cited

U.S. PATENT DOCUMENTS

| | | |
|---|---|---|
| 5,204,640 A | 4/1993 | Logan, Jr. |
| 5,220,292 A | 6/1993 | Bianchini et al. |
| 5,723,856 A | 3/1998 | Yao et al. |
| 5,751,747 A | 5/1998 | Lutes et al. |
| 5,777,778 A | 7/1998 | Yao |
| 5,917,179 A | 6/1999 | Yao |
| 5,929,430 A | 7/1999 | Yao et al. |
| 5,985,166 A | 11/1999 | Unger et al. |
| 6,080,586 A | 6/2000 | Baldeschwieler et al. |
| 6,178,036 B1 | 1/2001 | Yao |
| 6,203,660 B1 | 3/2001 | Unger et al. |
| 6,389,197 B1 | 5/2002 | Iltchenko et al. |
| 6,417,957 B1 | 7/2002 | Yao |
| 6,473,218 B1 | 10/2002 | Maleki et al. |
| 6,476,959 B2 | 11/2002 | Yao |
| 6,487,233 B2 | 11/2002 | Maleki et al. |
| 6,488,861 B2 | 12/2002 | Iltchenko et al. |
| 6,490,039 B2 | 12/2002 | Maleki et al. |
| 6,535,328 B2 | 3/2003 | Yao |
| 6,545,791 B1 * | 4/2003 | McCaughan et al. ......... 359/245 |
| 6,567,436 B1 | 5/2003 | Yao et al. |
| 6,580,532 B1 | 6/2003 | Yao et al. |
| 6,594,061 B2 | 7/2003 | Huang et al. |
| 6,762,869 B2 * | 7/2004 | Maleki et al. ................. 359/239 |
| 6,795,481 B2 | 9/2004 | Maleki et al. |
| 6,798,947 B2 | 9/2004 | Iltchenko |
| 6,823,110 B2 * | 11/2004 | Battiato et al. .................. 385/37 |
| 6,853,479 B1 | 2/2005 | Ilchenko et al. |
| 6,871,025 B2 | 3/2005 | Maleki et al. |

(Continued)

FOREIGN PATENT DOCUMENTS

WO 01/96936 12/2001

(Continued)

OTHER PUBLICATIONS

Braginsky, V.B., et al., "Quality-Factor and Nonlinear Properties of Optical Whispering-Gallery Modes," *Physics Letters A*, 137(7, 8):393-397, May 1989.

(Continued)

*Primary Examiner* — Mohammed Hasan
(74) *Attorney, Agent, or Firm* — Perkins Coie LLP

(57) ABSTRACT

Techniques and devices for tuning a phase shift of an RF or microwave signal by using an optical tuning mechanism based on photonic elements.

16 Claims, 4 Drawing Sheets

U.S. PATENT DOCUMENTS

| | | | |
|---|---|---|---|
| 6,873,631 | B2 | 3/2005 | Yao et al. |
| 6,879,752 | B1 | 4/2005 | Ilchenko et al. |
| 6,901,189 | B1 | 5/2005 | Savchenkov et al. |
| 6,906,309 | B2 | 6/2005 | Sayyah et al. |
| 6,922,497 | B1 | 7/2005 | Savchenkov et al. |
| 6,928,091 | B1 | 8/2005 | Maleki et al. |
| 6,943,931 | B1* | 9/2005 | Dingel .................. 359/279 |
| 6,943,934 | B1 | 9/2005 | Ilchenko et al. |
| 6,961,166 | B2* | 11/2005 | Wooten et al. ............ 359/245 |
| 6,987,914 | B2 | 1/2006 | Savchenkov et al. |
| 7,024,069 | B2 | 4/2006 | Savchenkov et al. |
| 7,043,117 | B2 | 5/2006 | Matsko et al. |
| 7,050,212 | B2 | 5/2006 | Matsko et al. |
| 7,061,335 | B2 | 6/2006 | Maleki et al. |
| 7,062,131 | B2 | 6/2006 | Ilchenko |
| 7,092,591 | B2 | 8/2006 | Savchenkov et al. |
| 7,133,180 | B2 | 11/2006 | Ilchenko et al. |
| 7,173,749 | B2 | 2/2007 | Maleki et al. |
| 7,184,451 | B2 | 2/2007 | Ilchenko et al. |
| 7,187,870 | B2 | 3/2007 | Ilchenko et al. |
| 7,218,662 | B1 | 5/2007 | Ilchenko et al. |
| 7,248,763 | B1 | 7/2007 | Kossakovski et al. |
| 7,260,279 | B2 | 8/2007 | Gunn et al. |
| 7,283,707 | B1 | 10/2007 | Maleki et al. |
| 7,356,214 | B2 | 4/2008 | Ilchenko |
| 7,362,927 | B1 | 4/2008 | Ilchenko et al. |
| 7,369,722 | B2 | 5/2008 | Yilmaz et al. |
| 7,389,053 | B1 | 6/2008 | Ilchenko et al. |
| 7,400,796 | B1 | 7/2008 | Kossakovski et al. |
| 7,440,651 | B1 | 10/2008 | Savchenkov et al. |
| 7,460,746 | B2 | 12/2008 | Maleki et al. |
| 7,480,425 | B2 | 1/2009 | Gunn et al. |
| 2001/0038651 | A1 | 11/2001 | Maleki et al. |
| 2002/0018611 | A1 | 2/2002 | Maleki et al. |
| 2002/0018617 | A1 | 2/2002 | Iltchenko et al. |
| 2002/0021765 | A1 | 2/2002 | Maleki et al. |
| 2002/0081055 | A1 | 6/2002 | Painter et al. |
| 2002/0085266 | A1 | 7/2002 | Yao |
| 2002/0097401 | A1 | 7/2002 | Maleki et al. |
| 2003/0160148 | A1 | 8/2003 | Yao et al. |
| 2004/0100675 | A1 | 5/2004 | Matsko et al. |
| 2004/0109217 | A1 | 6/2004 | Maleki et al. |
| 2004/0218880 | A1 | 11/2004 | Matsko et al. |
| 2004/0240781 | A1 | 12/2004 | Savchenkov et al. |
| 2005/0017816 | A1 | 1/2005 | Ilchenko et al. |
| 2005/0063034 | A1 | 3/2005 | Maleki et al. |
| 2005/0074200 | A1 | 4/2005 | Savchenkov et al. |
| 2005/0123306 | A1 | 6/2005 | Ilchenko et al. |
| 2005/0128566 | A1 | 6/2005 | Savchenkov et al. |
| 2005/0175358 | A1 | 8/2005 | Ilchenko et al. |
| 2005/0248823 | A1 | 11/2005 | Maleki et al. |
| 2007/0009205 | A1 | 1/2007 | Maleki et al. |
| 2007/0153289 | A1 | 7/2007 | Yilmaz et al. |
| 2008/0001062 | A1 | 1/2008 | Gunn et al. |
| 2008/0075464 | A1 | 3/2008 | Maleki et al. |
| 2008/0310463 | A1 | 12/2008 | Maleki et al. |
| 2009/0097516 | A1 | 4/2009 | Maleki et al. |
| 2009/0135860 | A1 | 5/2009 | Maleki et al. |

FOREIGN PATENT DOCUMENTS

| | | |
|---|---|---|
| WO | 2005/038513 | 4/2005 |
| WO | 2005/055412 | 6/2005 |
| WO | 2005/067690 | 7/2005 |
| WO | 2005/122346 | 12/2005 |
| WO | 2006/076585 | 7/2006 |
| WO | 2007/143627 | 12/2007 |

OTHER PUBLICATIONS

Eliyahu, D., et al., "Low Phase Noise and Spurious Levels in Multi-Loop Opto-Electronic Oscillators," *Proceedings of the 2003 IEEE International Frequency Control Sympsoium and PDA Exhibition*, pp. 405-410, May 2003.

Eliyahu, D., et al., "Modulation Response ($S_{21}$) of the Coupled Opto-Electronic Oscillator," *Proceedings of the 2005 IEEE International Frequency Control Symposium and Exposition*, pp. 850-856, Aug. 2005.

Eliyahu, D., et al., "Tunable, Ultra-Low Phase Noise YIG Based Opto-Electronic Oscillator," *IEEE MTT-S International Microwave Symposium Digest*, 3:2185-2187, Jun. 2003.

Gorodetsky, M.L., et al., "Optical Microsphere Resonators: Optimal Coupling to High-$Q$ Whispering-Gallery Modes," *J. Opt. Soc. Am. B*, 16(1):147-154, Jan. 1999.

Gorodetsky, M.L., et al., "Rayleigh Scattering in High-$Q$ Microspheres," *J. Opt. Soc. Am. B*, 17(6):1051-1057, Jun. 2000.

Gorodetsky, M.L., et al., "Ultimate $Q$ of Optical Microsphere Resonators," *Optics Letters*, 21(7):453-455, Apr. 1996.

Hryniewicz, J.V., et al., "Higher Order Filter Response in Coupled Microring Resonators," *IEEE Photonics Technology Letters*, 12(3):320-322, Mar. 2000.

Huang, S., et al., "A 'Turnkey' Optoelectronic Oscillator with Low Acceleration Sensitivity," *2000 IEEE/EIA International Frequency Control Symposium and Exhibition*, pp. 269-279, Jun. 2000.

Ilchenko, V., et al., "Electrooptically Tunable Photonic Microresonators and Photonic Bandgap Waveguide Coupling for Micro-Optoelectronic Oscillators," *GOMACTech 2003*, Tampa, Florida, pp. 1-4.

Ilchenko, V., et al., "High-Q Microsphere Cavity for Laser Stabilization and Optoelectronic Microwave Oscillator," *Proceedings SPIE Microresonators and Whispering-Gallery Modes*, vol. 3611, pp. 190-198, Jan. 1999.

Ilchenko, V., et al., "Microsphere Integration in Active and Passive Photonics Devices," *Proc. of SPIE Laser Resonators III*, vol. 3930, pp. 154-162, Jan. 2000.

Ilchenko, V., et al., "Microtorus: A High-Finesse Microcavity with Whispering-Gallery Modes," *Optics Letters*, 26(5):256-258, Mar. 2001.

Ilchenko, V., et al., "Pigtailing the High-$Q$ Microsphere Cavity: A Simple Fiber Coupler for Optical Whispering-Gallery Modes," *Optics Letters*, 24(11):723-725, Jun. 1999.

Ilchenko, V., et al., "Tunability and Synthetic Lineshapes in High-Q Optical Whispering Gallery Modes," *Proc. of SPIE Laser Resonators and Beam Control VI*, vol. 4969, pp. 195-206, Jan. 2003.

Ilchenko, V., et al., "Whispering-Gallery-Mode Electro-Optic Modulator and Photonic Microwave Receiver," *J. Opt. Soc. Am. B*, 20(2):333-342, Feb. 2003.

Ilchenko, V., et al., "Sub-Micro Watt Photonic Microwave Receiver," *IEEE Photonics Technology Letters*, 14(11):1602-1604, Nov. 2002.

Ito, H., et al., "InP/InGaAs Uni-Travelling-Carrier Photodiode with 310 GHz Bandwidth," *Electronics Letters*, 36(21):1809-1810, Oct. 2000.

Logan, R., et al., "Stabilization of Oscillator Phase Using a Fiber-Optic Delay-Line," *IEEE 45th Annual Symposium on Frequency Control*, pp. 508-512, May 1991.

Maleki, L., "The Opto-Electronic Oscillator: Prospects for Extending the State of the Art in Reference Frequency Generation," *International Topical Meeting on Microwave Photonics*, pp. 195-198, Oct. 1998.

Matsko, A., et al., "Active Mode Locking with Whispering-Gallery Modes," *J. Opt. Soc. Am. B*, 20(11):2292-2296, Nov. 2003.

Matsko, A., et al., "Whispering-Gallery-Mode based Optoelectronic Microwave Oscillator," *Journal of Modern Optics*, 50(15-17):2523-2542, Feb. 2004.

Matsko, A., et al., "Whispering-Gallery-Mode Resonators as Frequency References. I. Fundamental Limitations," *J. Opt. Soc. Am. B*, 24(6):1324-1335, Jun. 2007.

Myers, L.E., et al., "Quasi-Phase-Matched Optical Parametric Oscillators in Bulk Periodically Poled $LiNbO_3$," *J. Opt. Soc. Am. B*, 12(11):2102-2116, Nov. 1995.

Savchenkov, A., et al., "Whispering-Gallery-Mode Resonators as Frequency References. II. Stabilization," *J. Opt. Soc. Am. B*, 24(12):2988-2997, Dec. 2007.

Vassiliev, V.V., et al., "Narrow-Line-Width Diode Laser with a High-$Q$ Microsphere Resonator," *Optics Communications*, 158(1-6):305-312, Dec. 1998.

Yao, X.S., et al., "A Novel Photonic Oscillator," *Digest of the LEOS Summer Topical Meetings*, pp. 17-18, Aug. 1995.

Yao, X.S., et al., "A Novel Photonic Oscillator," *TDA Progress Report 42-122*, pp. 32-43, Aug. 1995.

Yao, X.S., et al., "Converting Light into Spectrally Pure Microwave Oscillation," *Optics Letters*, 21(7):483-485, Apr. 1996.

Yao, X.S., et al., "Coupled Optoelectronic Oscillators for Generating Both RF Signal and Optical Pulses," *Journal of Lightwave Tecnhology*, 18(1):73-78, Jan. 2000.

Yao, X.S., et al., "Dual Microwave and Optical Oscillator," *Optics Letters*, 22(24):1867-1869, Dec. 1997.

Yao, X.S., et al., "Multiloop Optoelectronic Oscillator," *IEEE Journal of Quantum Electronics*, 36(1):79-84, Jan. 2000.

Yao, X.S., et al., "Optoelectronic Microwave Oscillator," *J. Opt. Soc. Am. B*, 13(8):1725-1735, Aug. 1996.

Yao, X.S., et al., "Optoelectronic Oscillator for Photonic Systems," *IEEE Journal of Quantum Electronics*, 32(7):1141-1149, Jul. 1996.

Yu, J., et al., "Compact Optoelectronic Oscillator with Ultra-Low Phase Noise Performance," *Electronics Letters*, 35(18):1554-1555, Sep. 1999.

* cited by examiner

PHOTONIC RF AND MICROWAVE PHASE SHIFTERS

PRIORITY CLAIM AND RELATED PATENT APPLICATION

This patent document claims the priority of U.S. Provisional Application No. 61/036,858 entitled "Photonic Microwave Phase Shifter" and filed on Mar. 14, 2008, the entire disclosure of which is incorporated by reference as part of the disclosure of this document.

BACKGROUND

This document relates to RF and microwave devices based on photonic elements.

RF and microwave signal generation and processing may be achieved in the optical domain using photonic elements. Examples include generation of RF and microwave oscillations using opto-electronic oscillators and filtering of RF and microwave signals using optical filtering by narrow band optical resonator filters. Notably, certain optical resonators can be configured to exhibit high resonator quality factors to provide narrow bandwidths. A whispering gallery mode (WGM) resonator, for example, has a structure that confines light in a whispering gallery mode that is totally reflected within a closed circular optical path. Light in WGM resonators cannot exit the resonators by optical transmission and thus can be used to produce optical resonators with high optical quality factors that may be difficult to achieve with other optical resoanorts such as Fabry-Perot resonators. Light in a WGM resonator "leaks" out of the exterior surface of the closed circular optical path of a WGM resonator via the evanescence field of the WG mode.

SUMMARY

This document describes implementations of techniques and devices for tuning a phase shift of an RF or microwave signal by using an optical tuning mechanism based on photonic elements.

In one aspect, this document provides a method for shifting a phase of an RF or microwave signal. This method includes operating an optical modulator to modulate light of a laser beam in response to an input RF or microwave signal at an RF or microwave frequency to produce modulated light that carries the input RF or microwave signal in the optical domain, optically processing the modulated light to produce an optical output that has an optical phase shift, and detecting the optical output to produce an output RF or microwave signal at the RF or microwave frequency of the input RF or microwave signal with a phase shift that corresponds to the optical phase shift.

In another aspect, this document provides a method for shifting a phase of an RF or microwave signal. The method includes directing laser light at a laser carrier frequency from a laser into an optical interferometer which includes a first optical path and a second optical path that intersect to produce optical interference between light in the first and second optical paths, applying an input RF or microwave signal at an RF or microwave frequency to perform an optical modulation on light in the second optical path to produce modulated laser light in the second optical path to produce modulation sidebands at two sides of the laser carrier frequency in the modulated laser light, optically filtering the modulated laser light in the second optical path to produce filtered laser light having a selected modulation sideband that is away from the laser carrier frequency by the RF or microwave frequency while being free of spectral components outside the selected modulation sideband, including light at the laser carrier frequency and one or more other modulation sidebands, and combing the filtered laser light in the second optical path and the laser light in the first optical path at a photodetector to recover the input RF or microwave signal with a phase shift that is determined a relative optical phase shift between the first optical path and the second optical path of the optical interferometer.

In another aspect, this document provides a phase shifter device for shifting a phase of an RF or microwave signal to include a laser that produces a laser output beam at a laser carrier frequency, a photonic module and a photodetector. The photonic module includes an input port that receives an input RF or microwave signal at an RF or microwave frequency, an optical interferometer that receives the laser output beam from the laser and to produce an optical output based on optical interference of two portions of the received optical output beam from the laser, a phase shifting mechanism that causes an optical phase shift between the two portions of the received optical output beam in the optical interferometer, an optical modulator that modulates one of the two portions of the received optical output beam in the optical interferometer in response to the input RF or microwave signal to produce modulated light, and an optical filter that filters the modulated light in the optical interferometer to produce filtered light that carries the input RF or microwave signal. The photodetector converts an optical output of the optical interferometer into an output RF or microwave signal at the RF or microwave frequency of the input RF or microwave signal with a phase shift corresponding to the optical phase shift.

In yet another aspect, this document provides a phase shifter device for shifting a phase of an oscillation signal. This device includes a laser that produces a laser output beam at a laser carrier frequency and an optical interferometer located in an optical path of the laser output beam to receive the laser output beam. The optical interferometer includes (1) an optical splitter that splits the laser output beam into a first laser beam and a second laser beam, (2) a first optical path that receives the first laser beam, (3) a second optical path that receives the second laser beam, and (4) an optical combiner where the first and second optical paths meet and terminate. The optical combiner combines the first laser beam and the second laser beam to produce a combined optical output. An optical modulator is coupled in the second optical path of the optical interferometer to cause a modulation of light in the second optical path at a modulation frequency in response to an input oscillation signal oscillating at the modulation frequency to introduce modulation sidebands at two sides of the laser carrier frequency in the second optical beam. An optical resonator is optically coupled in the second optical path between the optical modulator and the optical combiner to filter the second optical beam output by the optical modulator to transmit light at a selected modulation sideband while rejecting light outside the selected modulation sideband, including light at the laser carrier frequency and one or more other modulation sidebands. This device also includes a photodetector located to receive the combined optical output from the optical combiner of the optical interferometer and to convert the received combined optical output into an output oscillation signal whose phase is shifted relative to a phase of the input oscillation signal by a relative optical phase shift between the first optical path and the second optical path of the optical interferometer.

These and other aspects and implementations are described in detail in the drawings, the description and the claims.

DETAILED DESCRIPTION

The phase shifting of an RF or microwave signal based on optical processing using photonic elements can use optical processing to achieve signal processing functions that may be easier than or better than achieved with RF or microwave components. For example, RF delays may require long conductive paths to generate desired delays in RF signals. When the same amount of the delay in the RF is generated in the optical domain, a much shorter optical delay can be used by virtue by operating in the optical domain. For another example, narrow RF filtering with a sharp spectral roll-off can be difficult to achieve and the same RF filtering can be performed in the optical domain by using a narrow bandwidth optical filter. The following exemplary implementations of techniques and devices for tuning a phase shift of an RF or microwave signal use an optical tuning mechanism based on photonic elements to exploit the technical advantages of optical processing.

Figure 1:
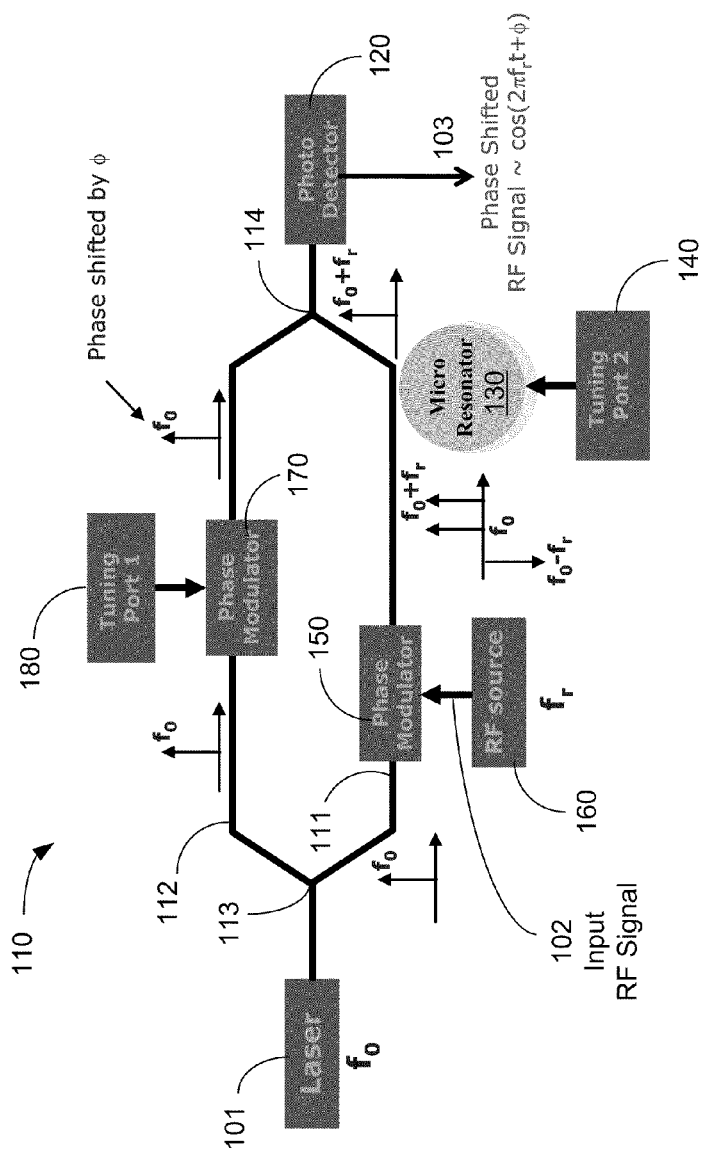
FIG. 1 shows an example of a phase shift device that shifts the phase of an RF or microwave signal.

FIG. 1 shows an example of a phase shift device that shifts the phase of an RF or microwave signal based on optical processing. This device includes a laser 101 that produces a laser output beam at a laser carrier frequency f0. In this example, the laser output beam is a continuous wave (CW) beam. An optical interferometer 110, e.g., a Mach-Zehnder interferometer, is located in an optical path of the laser output beam to receive the laser output beam. The optical interferometer 110 in this example includes an optical splitter 113 that splits the laser output beam into a first laser beam and a second laser beam, a first optical path 111 that receives the first laser beam from the optical splitter 113 and a second optical path 112 that receives the second laser beam from the optical splitter 113. The optical interferometer uses an optical combiner 114 at which the first and second optical paths meet and terminate to combine light from the two optical paths 111 and 112 to produce a combined optical output. A photodetector 120 is used to receive the combined optical output and to convert the received light into an detector output 103. This detector output 103 is an output RF or microwave signal that is phase shifted from an input RF or microwave signal that is used to modulate the light in the first optical path 111.

The above optical modulation is implemented by an optical modulator 150, e.g., an optical phase modulator, that is coupled in the first optical path 111 of the optical interferometer 110 to cause an optical modulation of light in the first optical path 111 at a modulation frequency (fr) in response to an input oscillation signal 102 oscillating at the modulation frequency to introduce modulation sidebands at two sides of the laser carrier frequency in the first optical beam. As an example, FIG. 1 shows the two first order modulation sidebands at (f0+fr) and (f0−fr) on the opposite sides of the laser carrier frequency f0. An RF or microwave source 160 is used to supply the input signal 102 to be processed by the phase shift device in FIG. 1. In some applications, the frequency range of the signal 102 can be from 40 MHz to 40 GHz.

An optical resonator 130 is optically coupled in the first optical path between the optical modulator 150 and the optical combiner 114 to operate as an optical bandpass filter. This filter is to filter the first optical beam output by the optical modulator 150 to transmit light at a selected modulation sideband (e.g., f0+fr) while rejecting light outside the selected modulation sideband, including light at the laser carrier frequency f0 and one or more other modulation sidebands (e.g., f0−fr). The center of the transmission band of the filter 130 can be at an optical frequency that is shifted from the laser carrier frequency f0 by the signal frequency fr of the input signal 102. The optical resonator 130 can be a high quality factor micro resonator that support whispering gallery modes to provide desired narrow band filtering. An optical evanescent coupler is used to provide the optical coupling between the micro resonator 130 and the first optical path 111. Other optical resonators or optical filters may also be used as the filter 130.

The optical filter 130 can be a fixed optical filter or a tunable optical filter. When the filter 130 is tunable to change its center frequency of the transmission band, the frequency of the output RF or microwave signal 103 is changed accordingly. Hence, the tuning of the optical filter 130 can be used to tune the frequency of the output RF or microwave signal 103 output by the photodetector 120. Hence, for example, the optical filter 130 can be first tuned to a first resonance frequency to produce a phase-shifted output signal 103 at a first RF or microwave frequency and then tuned to a different resonance frequency to produce another phase-shifted output signal 103 at a different RF or microwave frequency. In some applications, the input signal 102 can be a tunable signal that changes its frequency so the filter 130 is tuned accordingly. In some cases, the input signal 102 can be a broadband signal or can include multiple signals at different RF or microwave frequencies. The tunable filer 130 can be tuned to select a spectral component out of the broadband signal 102 or select a particular signal out of the multiple input signals 102. This tuning of the filter 130 for selecting the frequency of the output RF or microwave signal 103 can provide versatile applications for this phase shift device.

The resonator 130 can be tuned based on various mechanisms. A tuning port 140 can be provided in the device in FIG. 1 to allow injecting a control signal that tunes the optical resonator 130. A WGM resonator, for example, can be made from an electro-optic material and can be tuned by changing the electrical control signal applied to the material. In addition, the resonator 130 can be tuned by controlling the temperature of the resonator 130 or by applying a force or pressure to mechanically squeeze the resonator 130 by using an actuator such as a PZT actuator.

The second optical path 112 has an optical phase delay of ϕ relative to the first optical path 111. This optical phase delay of ϕ is transformed into a phase shift in the output RF or microwave signal 103. The two optical paths 111 and 112 can be designed to have a fixed optical phase delay of ϕ with respect to each other in some implementations. In other implementations, a tunable phase shifting device can be coupled to either one or both of the two optical paths 111 and 112 to adjust ϕ. For example, a phase shifter 170, such as a phase modulator operated under a DC bias, can be coupled to the second optical path 112 to control the ϕ. A phase tuning port 180 can be provided to allow for injecting a phase tuning signal that controls the phase shifter 170. This feature produces a variable phase shift in the output RF or microwave signal 103. This tuning of the phase shift in the signal 103 by controlling the optical phase delay φ between the two optical paths 111 and 112 and the tuning of the filter 130 can be combined to provide various useful functions and flexibilities in RF or microwave applications.

The photodetector 120 is located to receive the combined optical output from the optical combiner 114 of the optical interferometer 110 and to convert the received combined optical output into an output oscillation signal whose phase is shifted relative to a phase of the input oscillation signal by a relative optical phase shift of φ between the first optical path 111 and the second optical path 112 of the optical interferometer 120.

Consider the laser 101 that produces a CW laser beam with the following optical field amplitude $E = A\exp(j\omega_o t)$, where $\omega_o = 2\pi f_0$.

This beam is split into the first and second beams in the two optical paths 111 and 112, respectively. The second optical beam in the second optical path 112 has gained additional optical phase φ relative to light in the first optical path 111 when reaching the combiner 114:

$E2 = A2\exp(j\omega_o t + \phi)$.

The first optical beam in the first optical path 111, after passing the optical modulator 150 and the filter 130, can be expressed as:

$E2 = A2\exp(j[\omega_o + \omega_r]t)$, where $\omega_r = 2\pi f_r$.

At the beam combiner 114, the beams from the two paths 111 and 112 are spatially overlapped to produce the combined optical output with the following field:

$E\text{combined} = E1 + E2$.

The optical intensity of this combined optical output at the photodetector 120 is $I = |E|^2 = 2A1A2\cos(\omega_r t + \phi) + DC$ component.

Therefore, the output 103 of the photodetector 120 is an RF or microwave signal at the input frequency fr of the input signal 102 with a phase shift determined by the optical phase delay φ of the two paths 111 and 112 of the optical interferometer 110. Clearly, the optical phase delay is now converted into a phase shift in the RF or microwave signal 103.

Figure 2:
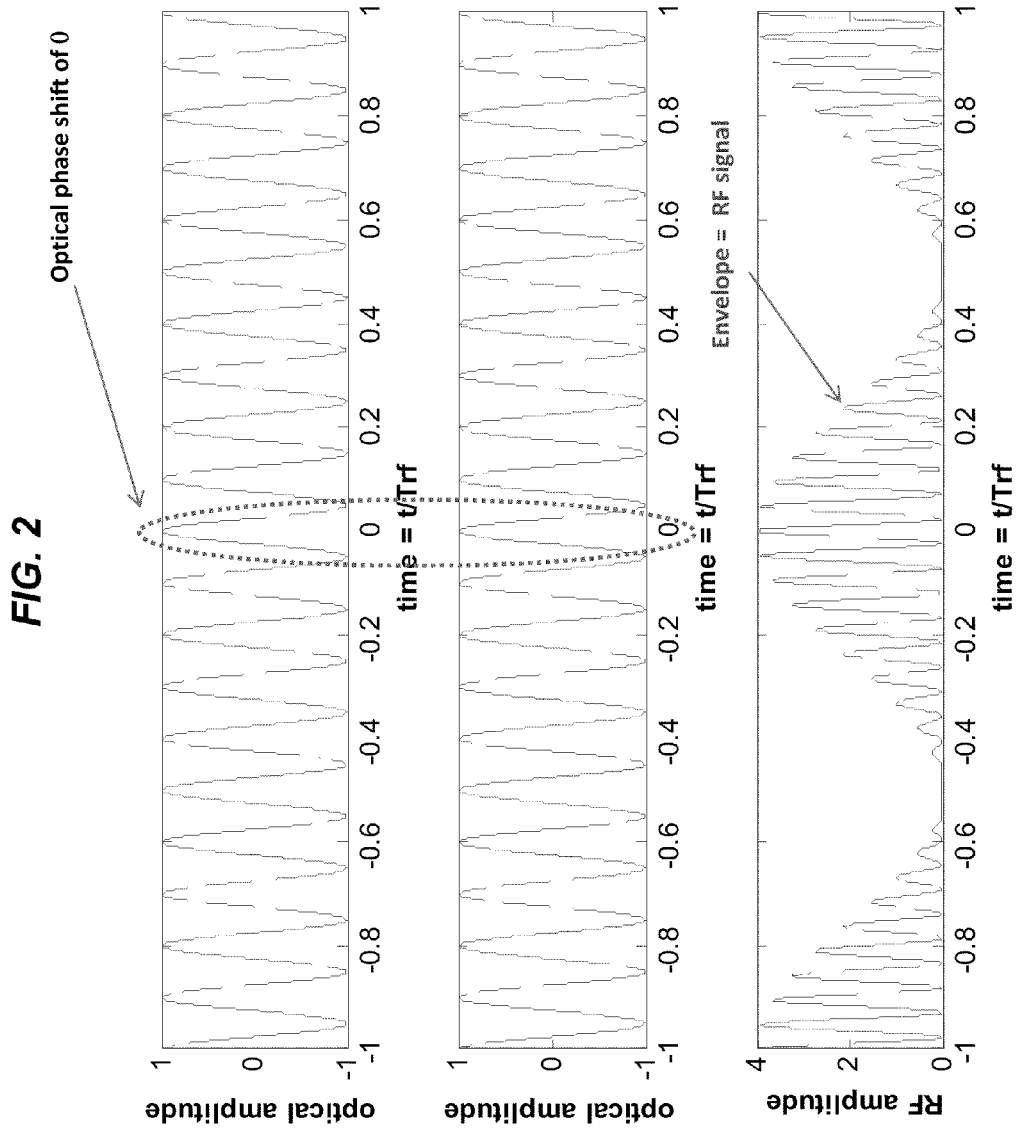
FIGS. 2 and 3 illustrate signals detected by the photodiode in FIG. 1.
Figure 3:
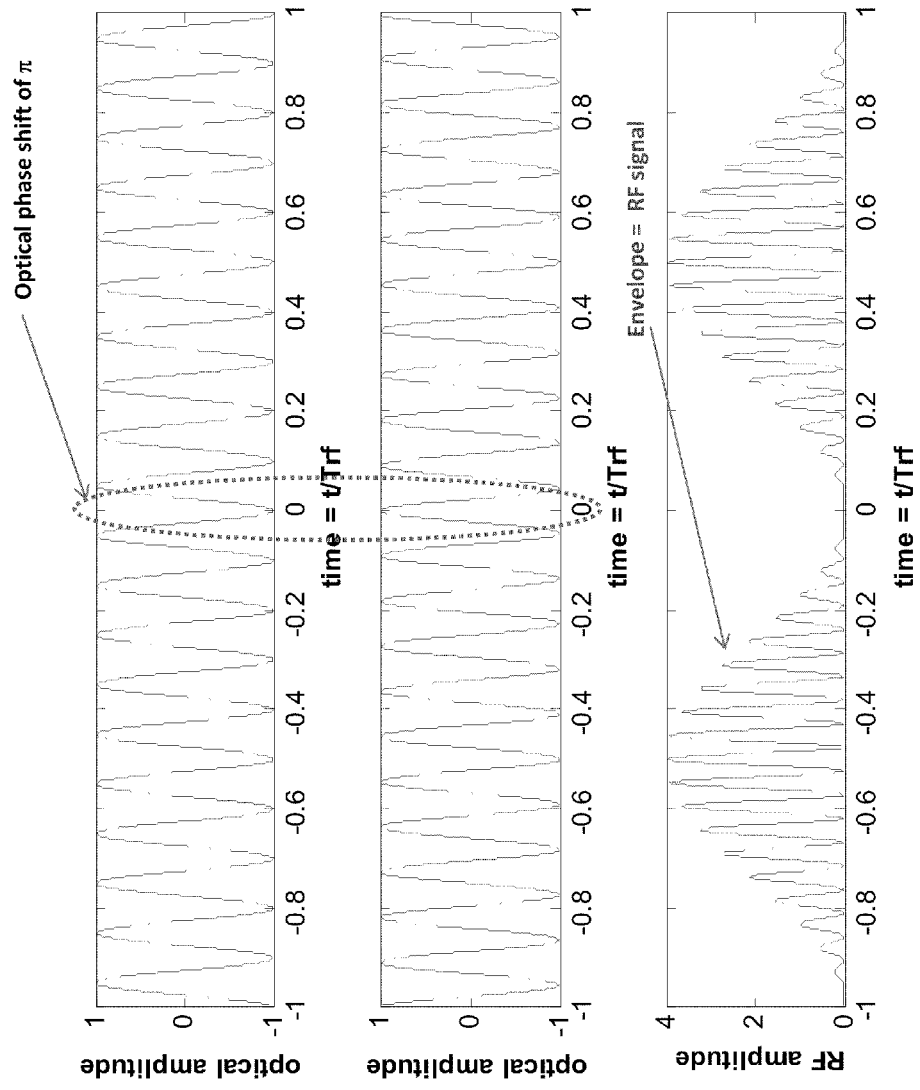

FIG. 2 shows the two optical beams in the two optical paths 111 and 112 are in phase when the relative optical phase sift between the paths 111 and 112 is zero (two upper traces) and the optical envelop of the combined optical output at the photodetector 120 (lower trace). FIG. 3 shows the two optical beams in the two optical paths 111 and 112 are out of phase by 180 degrees (two upper traces) and the optical envelop of the combined optical output at the photodetector 120 (lower trace). The envelope of the optical combined optical signal is an RF signal and is detected by the photodetector.

Figure 4:
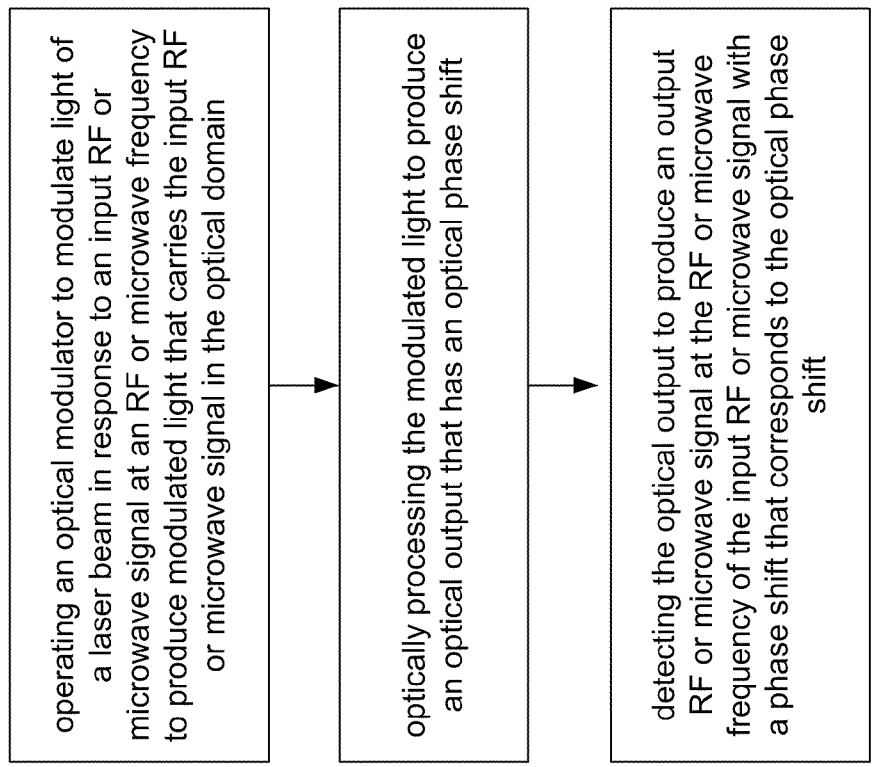
FIG. 4 shows a technique for producing a phase shifted RF or microwave signal based on optical processing using photonic elements.

Therefore, the phase shift device in FIG. 1 uses a photonic module to convert an input RF or microwave signal 102 into a signal in the optical domain and then performs signal processing in the optical domain (i.e., optical phase shifting and optical filtering) to achieve the phase shift in the RF or microwave signal. The phase shift device in FIG. 1 provides an example for carrying out a new technique for shifting a phase of an RF or microwave signal. Referring to FIG. 4, under this technique, an optical modulator is operated to modulate light of a laser beam in response to an input RF or microwave signal at an RF or microwave frequency to produce modulated light that carries the input RF or microwave signal in the optical domain. The modulated light is then optically processed to produce an optical output that has an optical phase shift that is produced in the optical domain. The optical output is detected to produce an output RF or microwave signal at the RF or microwave frequency of the input RF or microwave signal with a phase shift that corresponds to the optical phase shift.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. Variations and enhancements of the described implementations and other implementations can be made based on what is described and illustrated in this document.

What is claimed is:

1. A phase shifter device for shifting a phase of an oscillation signal, comprising: a laser that produces a laser output beam at a laser carrier frequency; an optical interferometer located in an optical path of the laser output beam to receive the laser output beam and comprising an optical splitter that splits the laser output beam into a first laser beam and a second laser beam, a first optical path that receives the first laser beam, a second optical path that receives the second laser beam, and an optical combiner where the first and second optical paths meet and terminate, the optical combiner combing the first laser beam and the second laser beam to produce a combined optical output; an optical modulator coupled in the second optical path of the optical interferometer to cause a modulation of light in the second optical path at a modulation frequency in response to an input oscillation signal oscillating at the modulation frequency to introduce modulation sidebands at two sides of the laser carrier frequency in the second optical beam; an optical resonator optically coupled in the second optical path between the optical modulator and the optical combiner to filter the second optical beam output by the optical modulator to transmit light at a selected modulation sideband while rejecting light outside the selected modulation sideband, including light at the laser carrier frequency and one or more other modulation sidebands; a photodetector located to receive the combined optical output from the optical combiner of the optical interferometer and to convert the received combined optical output into an output oscillation signal whose phase is shifted relative to a phase of the input oscillation signal by a relative optical phase shift between the first optical path and the second optical path of the optical interferometer.

2. The device as in claim 1, comprising:
a phase shifter in the first optical path to control an amount of the relative optical phase shift between the first optical path and the second optical path of the optical interferometer.

3. The device as in claim 1, wherein:
the optical resonator is a tunable optical resonator that tunes a resonance frequency of the optical resonator to change the frequency of the output oscillation signal whose phase is shifted.

4. The device as in claim 3, wherein:
the optical resonator is electronically tuned to change the frequency of the output oscillation signal.

5. The device as in claim 3, wherein:
the optical resonator is made of an electro-optic material and is tuned by an electrical voltage applied to the electro-optic material to change the frequency of the output oscillation signal.

6. The device as in claim 3, comprising:
a mechanism to control a temperature of the optical resonator to tune the optical resonator in changing the frequency of the output oscillation signal.

7. The device as in claim 3, comprising:
a mechanism that applies and controls a pressure exerted on the optical resonator to tune the optical resonator in changing the frequency of the output oscillation signal.

8. A method for shifting a phase of an RF or microwave signal, comprising:
directing laser light at a laser carrier frequency from a laser into an optical interferometer which includes a first optical path and a second optical path that intersect to produce optical interference between light in the first and second optical paths;
applying an input RF or microwave signal at an RF or microwave frequency to perform an optical modulation on light in the second optical path to produce modulated laser light in the second optical path to produce modulation sidebands at two sides of the laser carrier frequency in the modulated laser light;
optically filtering the modulated laser light in the second optical path to produce filtered laser light having a selected modulation sideband that is away from the laser carrier frequency by the RF or microwave frequency while being free of spectral components outside the selected modulation sideband, including light at the laser carrier frequency and one or more other modulation sidebands; and
combing the filtered laser light in the second optical path and the laser light in the first optical path at a photodetector to recover the input RF or microwave signal with a phase shift that is determined a relative optical phase shift between the first optical path and the second optical path of the optical interferometer.

9. The method as in claim 8, comprising:
tuning the relative optical phase shift between the first optical path and the second optical path of the optical interferometer to change the phase shift in the recovered input RF or microwave signal at the photodetector.

10. The method as in claim 8, comprising:
tuning an optical phase delay in the first optical path to change the phase shift in the recovered input RF or microwave signal at the photodetector.

11. The method as in claim 8, comprising:
operating a phase shifter in the first optical path to change the phase shift in the recovered input RF or microwave signal at the photodetector.

12. The method as in claim 8, comprising:
using a tunable optical resonator to perform the optical filtering in the second optical path; and
tuning the tunable optical resonator to change the frequency of the recovered RF or microwave signal with the phase shift.

13. The method as in claim 8, comprising:
using an optical micro resonator that supports whispering gallery modes in the second optical path to perform the optical filtering.

14. A method for shifting a phase of an RF or microwave signal, comprising:
operating an optical modulator to modulate light of a laser beam in response to an input RF or microwave signal at an RF or microwave frequency to produce modulated light that carries the input RF or microwave signal in the optical domain;
optically processing the modulated light to produce an optical output that has an optical phase shift; and
detecting the optical output to produce an output RF or microwave signal at the RF or microwave frequency of the input RF or microwave signal with a phase shift that corresponds to the optical phase shift,
wherein:
the light of the laser beam that is modulated by the optical modulator is a first portion of the laser beam and the modulated light is the modulated first portion, and
the optical processing includes:
filtering the modulated first portion to produce a filtered first portion which carries a selected optical modulation sideband while being free of light outside the selected optical modulation sideband;
causing an optical phase shift between the filtered first portion of the laser beam and a second portion of the same laser beam; and
causing optical interference between the filtered first portion and the second portion of the same laser beam to produce the optical output.

15. The method as in claim 14, comprising:
adjusting the optical phase shift to change the phase shift in the output RF or microwave signal.

16. The method as in claim 14, comprising:
using an electrically tunable optical micro resonator to adjust a center frequency of the filtered first portion to change the RF or microwave frequency of the output RF or microwave signal.

\* \* \* \* \*